United States Patent
Huang et al.

(10) Patent No.: US 8,189,404 B2
(45) Date of Patent: May 29, 2012

(54) STORAGE DEVICE AND METHOD FOR OPERATING THE SAME

(75) Inventors: Fu-Yin Huang, Taipei (TW);
Chung-Jwu Chen, Taipei (TW);
Tsang-Yi Chen, Taipei County (TW);
Chih-Heng Chiu, Taipei (TW);
Chung-Won Shu, Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 139 days.

(21) Appl. No.: 12/868,706

(22) Filed: Aug. 25, 2010

(65) Prior Publication Data
US 2012/0026796 A1    Feb. 2, 2012

(30) Foreign Application Priority Data
Jul. 27, 2010   (TW) ................................ 99124697 A

(51) Int. Cl.
*G11C 7/10* (2006.01)
*G11C 5/14* (2006.01)

(52) U.S. Cl. .............. 365/189.08; 365/189.09; 365/226; 365/228

(58) Field of Classification Search ............. 365/189.08, 365/189.09, 226, 228
See application file for complete search history.

(56) References Cited

U.S. PATENT DOCUMENTS

| 5,586,077 | A  | 12/1996 | Olivo |
| 6,160,431 | A  | 12/2000 | Crotty |
| 6,335,877 | B1 * | 1/2002 | Kang .......................... 365/145 |
| 6,879,193 | B2 | 4/2005 | Okamoto |
| 7,019,417 | B2 | 3/2006 | Kang |
| 7,408,475 | B2 | 8/2008 | Sugama |
| 7,439,782 | B2 | 10/2008 | Kamoshida |
| 7,570,091 | B2 | 8/2009 | Sugio |
| 7,696,795 | B2 | 4/2010 | Choi |

* cited by examiner

*Primary Examiner* — Ly D Pham
(74) *Attorney, Agent, or Firm* — Winston Hsu; Scott Margo

(57) ABSTRACT

A storage device includes a control unit, a first voltage supply unit for supplying a first working voltage to the control unit, N memory units, a second voltage supply unit for supplying a second working voltage to each memory unit, a logic gate, a first voltage detecting unit and a second voltage detecting unit. Once the first voltage detecting unit detects that the first working voltage of the control unit is abnormal, the logic gate outputs a first write protect signal to notify the control unit and control the memory units to enter a write protect mode. Once the second voltage detecting unit detects that the second working voltage of one or more memory units is abnormal, the logic gate outputs a second write protect signal to notify the control unit and control the one or more memory units to enter the write protect mode.

16 Claims, 4 Drawing Sheets

STORAGE DEVICE AND METHOD FOR OPERATING THE SAME

BACKGROUND OF THE INVENTION

1. Field of the Invention

The application relates to a storage device and a method for operating the storage device and, more particularly, to a storage device capable of detecting whether a working voltage of a control unit and a working voltage of a memory unit are normal. Once the working voltage of the control unit and/or the working voltage of the memory unit are abnormal, a logic gate is utilized to notify the control unit to take related measures and control the memory unit to enter a write protect mode.

2. Description of the Prior Art

A solid state drive (i.e. solid state disk, SSD) is a new generation storage device based on a non-volatile memory, such as a standard NAND flash memory, for replacing a conventional hard disk device. There are no rotatable disk-shaped structures, read/write heads, step motors and soon in the solid state drive. The solid state drive has advantages of low power consumption, no noise, vibration-resistant, and low heat generation. Furthermore, the solid state drive can be used to simulate a conventional hard disk device through a control chip and an IDE interface.

With the development of manufacturing technology, power consumption of the NAND flash memory is getting larger with larger capacity of the NAND flash memory. Since the conventional solid state drive utilizes one single voltage supply unit to supply working voltage to the controller and NAND flash memory, it may cause an abnormal working voltage in the controller, especially for the solid state drive with high capacity, so as to lead an error in accessing data.

SUMMARY OF THE INVENTION

Therefore, an objective of the application is to provide a storage device and a method for operating the storage device. The storage device utilizes different voltage supply units to supply working voltages to a control unit and a memory unit respectively in operation. Furthermore, the storage device is capable of detecting whether the working voltage of the control unit and the working voltage of the memory unit are normal.

According to one embodiment, a storage device of the application comprises a control unit, a first voltage supply unit, N memory units, a second voltage supply unit, a logic gate, a first voltage detecting unit and a second voltage detecting unit, wherein N is a positive integer. The first voltage supply unit is electrically connected to the control unit and used for supplying a first working voltage to the control unit. The second voltage supply unit is electrically connected to the N memory units and used for supplying a second working voltage to each memory unit. The logic gate is electrically connected to the control unit and the N memory units. The first voltage detecting unit is electrically connected to the control unit and the logic gate and used for detecting whether the first working voltage of the control unit is normal. The second voltage detecting unit is electrically connected to the N memory units and the logic gate and used for detecting whether the second working voltage of each memory unit is normal.

Once the first working voltage of the control unit is abnormal, the logic gate outputs a first write protect signal to notify the control unit and control the N memory units to enter a write protect mode. Once the second working voltage of M memory units of the N memory units is abnormal, the logic gate outputs a second write protect signal to notify the control unit and control at least a part of the N memory units to enter the write protect mode.

According to another embodiment, a method of the application for operating a storage device comprises: utilizing a first voltage supply unit to supply a first working voltage to a control unit via a logic gate; and utilizing a second voltage supply unit to supply a second working voltage to N memory units via the logic gate. Once the first working voltage is abnormal, the logic gate outputs a first write protect signal to notify the control unit and control the N memory units to enter a write protect mode. Once the second working voltage is abnormal, the logic gate outputs a second write protect signal to notify the control unit and control M memory units to enter the write protect mode, wherein M is a positive integer less than or equal to N.

As mentioned in the above, the storage device and the method for operating the storage device of the application utilize two voltage supply units to respectively supply the working voltages to the control unit and the memory units in operation and utilize two voltage detecting units to respectively detect whether the working voltage of the control unit and the working voltage of the memory units are normal. Once the working voltage of the control unit and/or the working voltage of the memory units are abnormal, the logic gate is utilized to notify the control unit to take related measures and control the memory units to entire the write protect mode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
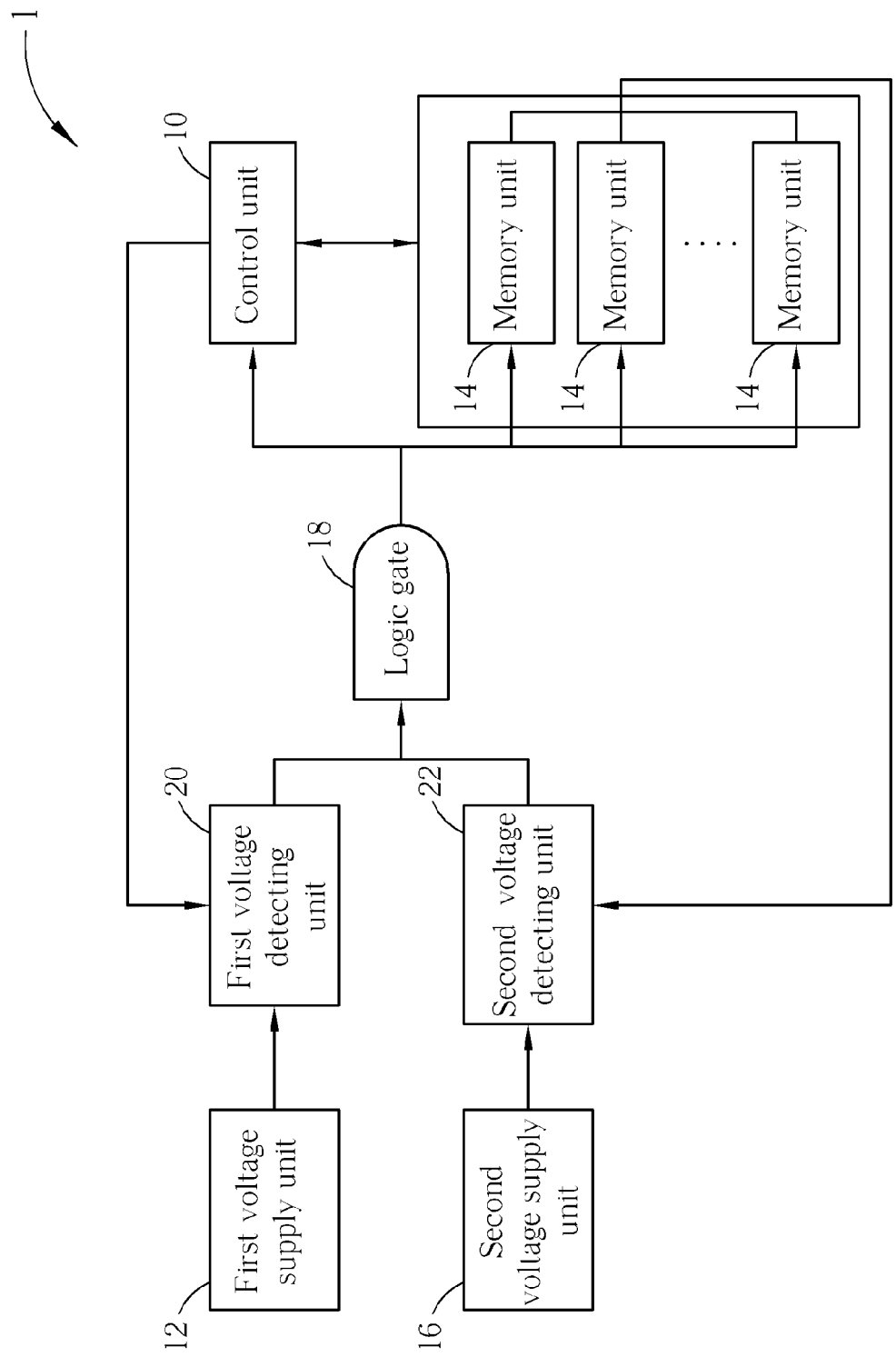
FIG. 1 is a functional block diagram illustrating a storage device according to one embodiment of the application.
Figure 2:
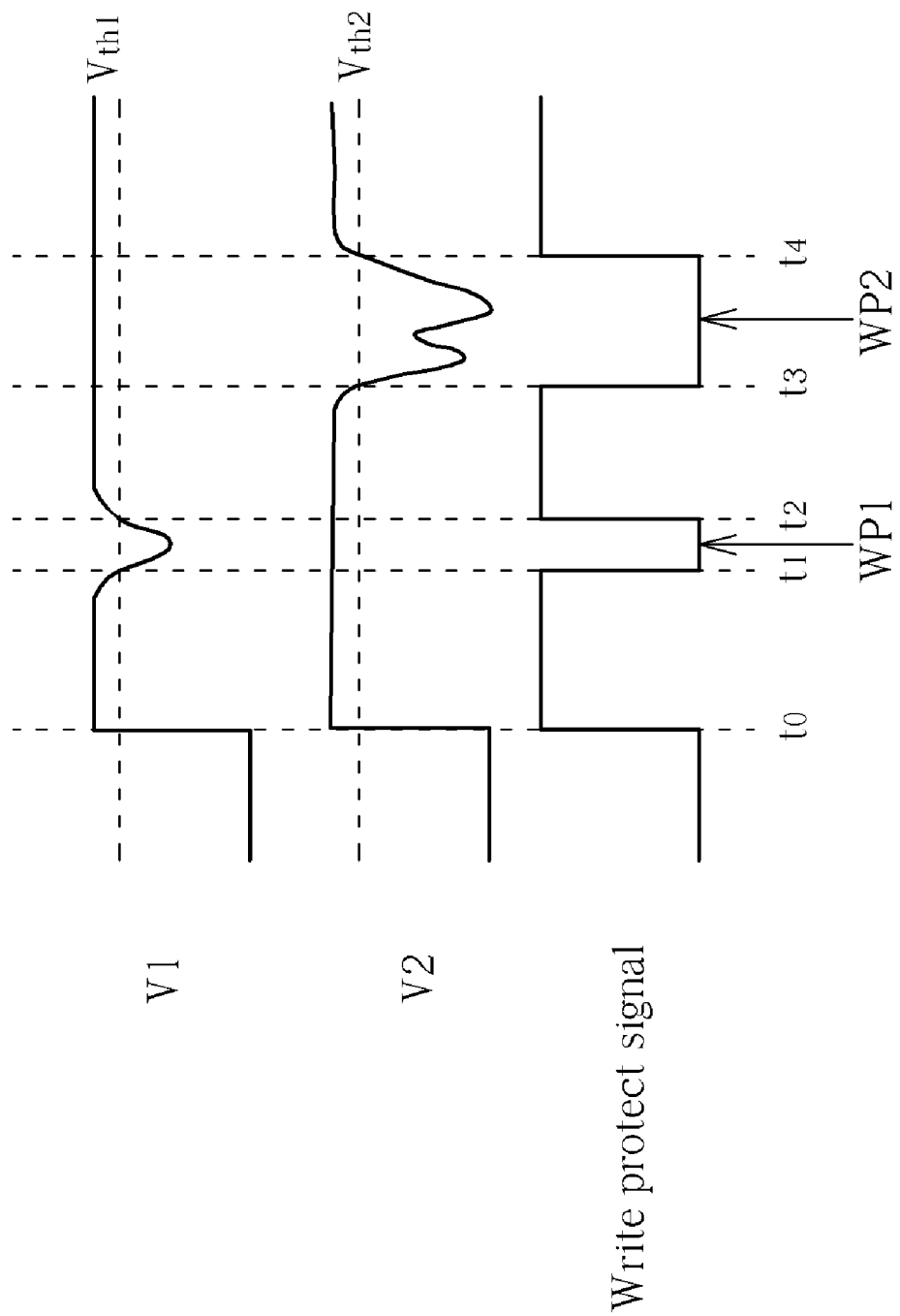
FIG. 2 is a timing diagram illustrating the operation of the storage device of FIG. 1.

Referring to FIG. 1 and FIG. 2, FIG. 1 is a functional block diagram illustrating a storage device 1 according to one embodiment of the application, and FIG. 2 is a timing diagram illustrating the operation of the storage device 1 of FIG. 1. As shown in FIG. 1, the storage device 1 comprises a control unit 10, a first voltage supply unit 12, N memory units 14, a second voltage supply unit 16, a logic gate 18, a first voltage detecting unit 20 and a second voltage detecting unit 22, wherein N is a positive integer. In this embodiment, the storage device 1 can be a solid state drive, the control unit 10 can be a solid state drive controller, each memory unit 14 can be a NAND flash memory respectively, and the logic gate 18 can be an AND gate. Besides, the number of the memory units 14 can be one or more, and it depends on practical application.

The logic gate 18 is electrically connected to the control unit 10 and each memory unit 14. The first voltage detecting unit 20 is electrically connected to the control unit 10 and the logic gate 18. The second voltage detecting unit 22 is electrically connected to each memory unit 14 and the logic gate 18. The first voltage supply unit 12 is electrically connected to the first voltage detecting unit 20, so as to be electrically connected to the control unit 10. The second voltage supply unit 16 is electrically connected to the second voltage detecting unit 22, so as to be electrically connected to each memory unit 14.

In this embodiment, the first voltage supply unit 12 is used to supply a first working voltage V1 to the control unit 10, and the second voltage supply unit 16 is used to supply a second working voltage V2 to each memory unit 14. The first voltage detecting unit 20 is used to detect whether the first working voltage V1 of the control unit 10 is normal, and the second voltage detecting unit 22 is used to detect whether the second working voltage V2 of each memory unit 14 is normal. Once the first working voltage V1 of the control unit 10 is abnormal, the logic gate 18 outputs a first write protect signal WP1 to notify the control unit 10 and control each memory unit 14 to enter a write protect mode. Once the second working voltage V2 of one or more memory units 14 is abnormal, the logic gate 18 outputs a second write protect signal WP2 to notify the control unit 10 and control the one or more memory units 14 to enter the write protect mode.

As shown in FIG. 2, during time t0 to t1, the first working voltage V1 is higher than a first threshold voltage Vth1, and the second working voltage V2 is higher than a second threshold voltage Vth2. The threshold voltage is a minimum voltage which drives components to work normally in operation. At this time, the first voltage detecting unit 20 detects that the first working voltage V1 of the control unit 10 is normal and then outputs a high voltage signal to the logic gate 18. At the same time, the second voltage detecting unit 22 detects that the second working voltage V2 of each memory unit 14 is normal and then also outputs a high voltage signal to the logic gate 18. Since the voltage signals outputted by the first voltage detecting unit 20 and the second voltage detecting unit 22 are both high, the logic gate 18 outputs a high voltage signal to the control unit 10 and each memory unit 14 (the logic gate 18 is an AND gate in this embodiment). At this time, the control unit 10 and each memory unit 14 work normally.

During time t1 to t2, the first working voltage V1 is lower than the first threshold voltage Vth1, and the second working voltage V2 is higher than the second threshold voltage Vth2. At this time, the first working voltage detecting unit 20 detects that the first working voltage V1 of the control unit 10 is abnormal and then outputs a low voltage signal to the logic gate 18. At the same time, the second voltage detecting unit 22 detects that the second working voltage V2 of each memory unit 14 is normal and then outputs a high voltage signal to the logic gate 18. Since the voltage signal outputted by the first voltage detecting unit 20 is low, and the voltage signal outputted by the second voltage detecting unit 22 is high, the logic gate 18 outputs a low voltage signal to the control unit 10 and each memory unit 14 (the logic gate 18 is an AND gate in this embodiment). At this time, the logic gate 18 outputs a first write protect signal WP1 (i.e. low voltage signal) to notify the control unit 10 to temporarily stop accessing each memory unit 14 and control each memory unit 14 to enter the write protect mode.

During time t3 to t4, the first working voltage V1 is higher than the first threshold voltage Vth1, and the second working voltage V2 is lower than the second threshold voltage Vth2. At this time, the first voltage detecting unit 20 detects that the first working voltage V1 of the control 10 is normal and then outputs a high voltage signal to the logic gate 18. At the same time, the second voltage detecting unit 22 detects that the second working voltage V2 of one or more memory units 14 is abnormal and then outputs a low voltage signal to the logic gate 18. Since the voltage signal outputted by the first voltage detecting unit 20 is high, and the voltage signal outputted by the second voltage detecting unit 22 is low, the logic gate 18 outputs a low voltage signal to the control unit 10 and the one or more abnormal memory units 14 (the logic gate 18 is an AND gate in this embodiment). At this time, the logic gate 18 outputs a second write protect signal WP2 (i.e. low voltage signal) to notify the control unit 10 to temporarily stop accessing the one or more abnormal memory units 14 and control the one or more abnormal memory units 14 to enter the write protect mode.

It should be noted that if the first working voltage V1 is lower than the first threshold voltage Vth1 and the second working voltage V2 is also lower than the second threshold voltage Vth2, the first voltage detecting unit 20 detects that the first working voltage V1 of the control unit 10 is abnormal, and the second voltage detecting unit 22 also detects that the second working voltage V2 of one or more memory units 14 is abnormal. At this time, the first voltage detecting unit 20 outputs a low voltage signal to the logic gate 18, and the second voltage detecting unit 22 also outputs a low voltage signal to the logic gate 18. Since the voltage signal outputted by the first voltage detecting unit 20 is low, and the voltage signal outputted by the second voltage detecting unit 22 is also low, the logic gate 18 outputs a low voltage signal to the control unit 10 and the one or more abnormal memory units 14 (the logic gate 18 is an AND gate in this embodiment). At this time, the logic gate 18 outputs a write protect signal (i.e. low voltage signal) to notify the control unit 10 to temporarily stop accessing each memory unit 14 and control each memory unit 14 to enter the write protect mode.

When the first working voltage and/or the second working voltage recover from abnormal to normal, the first voltage detecting unit 20 and the second voltage detecting unit 22 will output high voltage signals to the logic gate 18, such that the control unit 10 and each memory unit 14 work normally.

Figure 3:
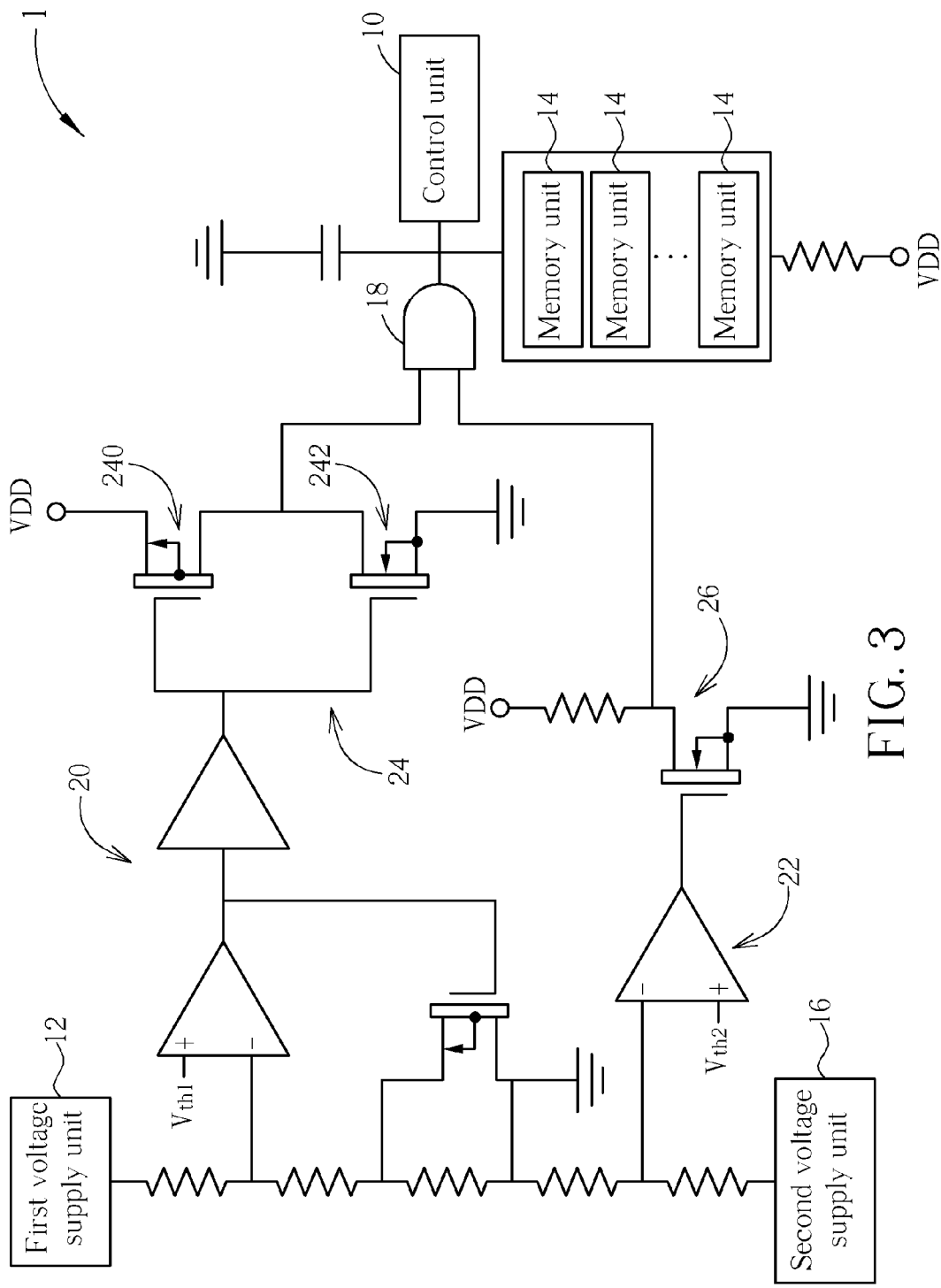
FIG. 3 is a circuit diagram illustrating the storage device according to one embodiment of the application.

Referring to FIG. 3, FIG. 3 is a circuit diagram illustrating the storage device 1 according to one embodiment of the application. As shown in FIG. 3, the storage device 1 of the application may comprise a Complementary Metal-Oxide-Semiconductor (CMOS) transistor 24 and an NMOS transistor 26, wherein the CMOS transistor 24 comprises a PMOS transistor 240 and an NMOS transistor 242. The CMOS transistor 24 is electrically connected between the first voltage detecting unit 20 and the logic gate 18, and the NMOS transistor 242 is electrically connected between the second voltage detecting unit 22 and the logic gate 18. Besides, VDD shown in FIG. 3 represents a voltage source. Once the first voltage detecting unit 20 detects that the first working voltage V1 of the control unit 10 is normal, the first voltage detecting unit 20 can control the PMOS transistor 240 to turn on and control the NMOS transistor 242 to turn off, so as to output a high voltage signal to the logic gate 18. On the other hand, once the first voltage detecting unit 20 detects that the first working voltage V1 of the control unit 10 is abnormal, the first voltage detecting unit 20 controls the PMOS transistor 240 to turn off and controls the NMOS transistor 242 to turn on, so as to output a low voltage signal to the logic gate 18. Similarly, once the second voltage detecting unit 22 detects that the second working voltage V2 of each memory unit 14 is normal, the second voltage detecting unit 22 controls the NMOS transistor 26 to turn on, so as to output a high voltage signal to the logic gate 18. On the other hand, once the second voltage detecting unit 22 detects that the second working voltage V2 of one or more memory units 14 is abnormal, the second voltage detecting unit 22 controls the NMOS transistor 26 to turn off, so as to output a low voltage signal to the logic gate 18.

It should be noted that the circuit design of the storage device 1 of the application can be determined based on practical application, and it is not limited to the circuit design shown in FIG. 3.

Figure 4:
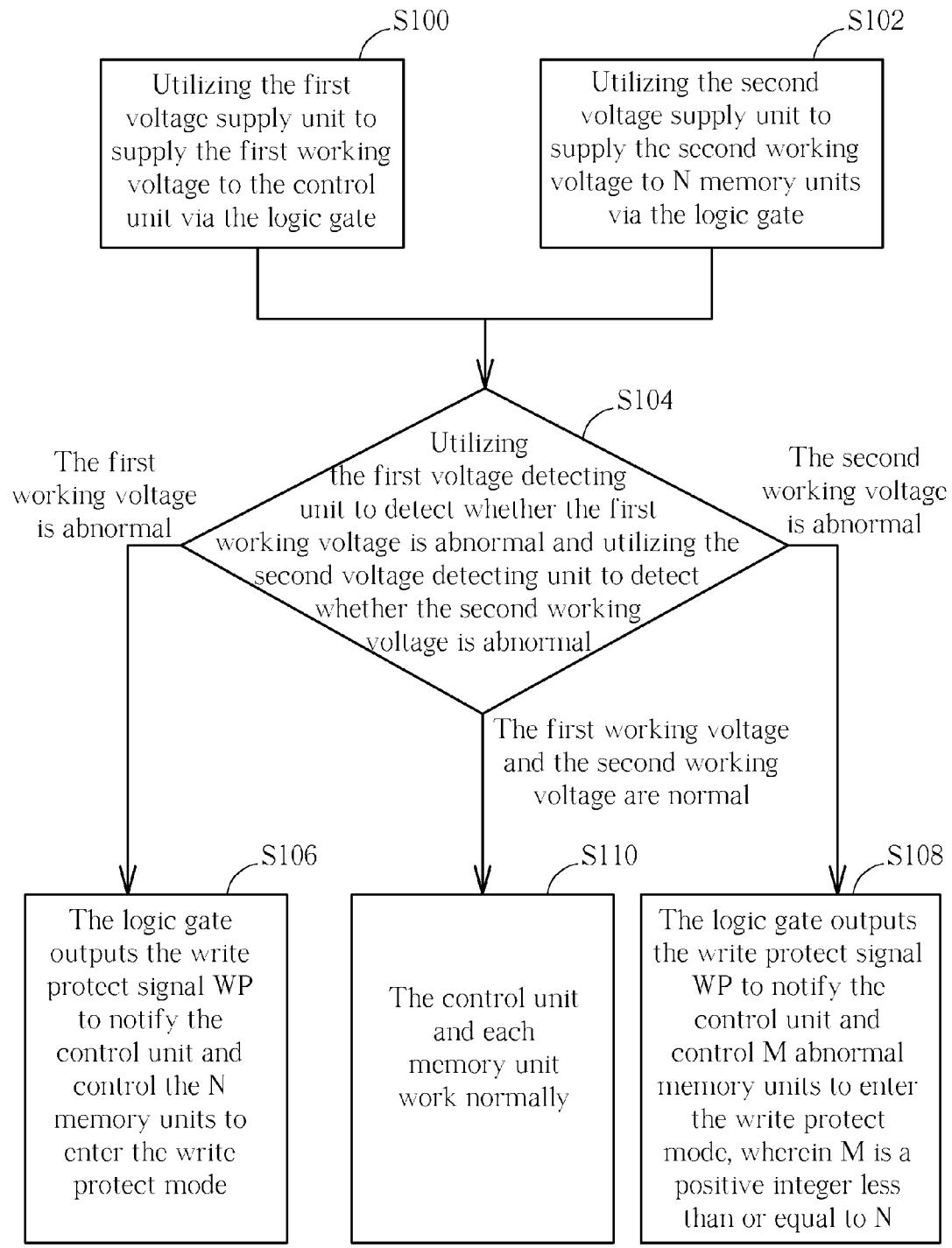
FIG. 4 is a flowchart of a method for operating the storage device according to one embodiment of the application.

Referring to FIG. 4, FIG. 4 is a flowchart of a method for operating the storage device 1 according to one embodiment of the application. Also referring to FIG. 1 and FIG. 2 along with the storage device 1 mentioned above, the method of the application comprises the following steps. First, step S100 is performed to utilize the first voltage supply unit 12 to supply the first working voltage V1 to the control unit 10 via the logic gate 18; and step S102 is performed to utilize the second voltage supply unit 16 to supply the second working voltage V2 to N memory units 14 via the logic gate 18. Afterward, step S104 is performed to utilize the first voltage detecting unit 20 to detect whether the first working voltage V1 is abnormal and to utilize the second voltage detecting unit 22 to detect whether the second working voltage V2 is abnormal. Once the first working voltage V1 is lower than the first threshold voltage Vth1, the first working voltage V1 is abnormal. Once the second working voltage V2 is lower than the second threshold voltage Vth2, the second working voltage V2 is abnormal. Once the first working voltage V1 is abnormal, the logic gate 18 outputs the first write protect signal WP1 to notify the control unit 10 and control the N memory units 14 to enter the write protect mode (step S106). Once the second working voltage V2 is abnormal, the logic gate 18 outputs the second write protect signal WP2 to notify the control unit 10 and control M abnormal memory units 14 to enter the write protect mode (step S108), wherein M is a positive integer less than or equal to N. If the first working voltage V1 and the second working voltage V2 are normal, the control unit 10 and each memory unit 14 work normally (step S110).

Compared to the conventional art, the storage device and the method for operating the storage device of the application utilize two voltage supply units to respectively supply the working voltages to the control unit and the memory units in operation and utilize two voltage detecting units to respectively detect whether the working voltage of the control unit and the working voltage of the memory units are normal. Once the working voltage of the control unit and/or the working voltage of the memory units are abnormal, the logic gate is utilized to notify the control unit to take related measures and control the memory units to entire the write protect mode. Accordingly, the application can effectively prevent errors in accessing data.

Those skilled in the art will readily observe that numerous modifications and alterations of the device and method may be made while retaining the teachings of the invention.

What is claimed is:

1. A storage device comprising:
a first voltage supply unit for supplying a first working voltage to a control unit through a logic gate;
a second voltage supply unit for supplying a second working voltage to each of N memory units through the logic gate, wherein N is a positive integer;
a first voltage detecting unit, electrically connected to the first voltage supply unit, for detecting whether the first working voltage is normal; and
a second voltage detecting unit, electrically connected to the second voltage supply unit, for detecting whether the second working voltage is normal;
wherein once the first working voltage is abnormal, the logic gate outputs a first write protect signal to notify the control unit and control the N memory units to enter a write protect mode; once the second working voltage is abnormal, the logic gate outputs a second write protect signal to notify the control unit and control at least a part of the N memory units to enter the write protect mode.

2. The storage device of claim 1, wherein once the first working voltage of the control unit is lower than a first threshold voltage, the first voltage detecting unit detects that the first working voltage of the control unit is abnormal.

3. The storage device of claim 1, wherein once the second working voltage of the memory unit is lower than a second threshold voltage, the second voltage detecting unit detects that the second working voltage of the memory unit is abnormal.

4. The storage device of claim 1, wherein the control unit is a solid state drive controller.

5. The storage device of claim 1, wherein each of the memory units is a NAND flash memory respectively.

6. The storage device of claim 1, wherein the logic gate is an AND gate.

7. A method for operating a storage device comprising:
utilizing a first voltage supply unit to supply a first working voltage to a control unit via a logic gate; and
utilizing a second voltage supply unit to supply a second working voltage to N memory units via the logic gate;
wherein once the first working voltage is abnormal, the logic gate outputs a first write protect signal to notify the control unit and control the N memory units to enter a write protect mode; once the second working voltage is abnormal, the logic gate outputs a second write protect signal to notify the control unit and control M memory units to enter the write protect mode, M is a positive integer less than or equal to N.

8. The method of claim 7, further comprising:
utilizing a first voltage detecting unit to detect whether the first working voltage is abnormal.

9. The method of claim 7, further comprising:
utilizing a second voltage detecting unit to detect whether the second working voltage is abnormal.

10. The method of claim 8, further comprising:
utilizing a second voltage detecting unit to detect whether the second working voltage is abnormal.

11. The method of claim 10, wherein once the first working voltage is lower than a first threshold voltage, the first working voltage is abnormal; once the second working voltage is lower than a second threshold voltage, the second working voltage is abnormal.

12. A storage device comprising:
a first voltage supply unit for supplying a first working voltage to a control unit through a logic gate; and
a second voltage supply unit for supplying a second working voltage to each of N memory units through the logic gate, wherein N is a positive integer;
wherein once the first working voltage is abnormal, the logic gate outputs a first write protect signal to notify the control unit and control the N memory units to enter a write protect mode; once the second working voltage is abnormal, the logic gate outputs a second write protect signal to notify the control unit and control at least a part of the N memory units to enter the write protect mode.

13. The storage device of claim 12, further comprising a first voltage detecting unit, electrically connected to the first voltage supply unit, for detecting whether the first working voltage is normal.

14. The storage device of claim 12, further comprising a second voltage detecting unit, electrically connected to the second voltage supply unit, for detecting whether the second working voltage is normal.

15. The storage device of claim 13, further comprising a second voltage detecting unit, electrically connected to the second voltage supply unit, for detecting whether the second working voltage is normal.

16. The storage device of claim 15, wherein once the first working voltage is lower than a first threshold voltage, the first working voltage is abnormal; and once the second working voltage is lower than a second threshold voltage, the second working voltage is abnormal.

* * * * *